(12) United States Patent
Ebisui

(10) Patent No.: US 9,448,102 B2
(45) Date of Patent: Sep. 20, 2016

(54) PHOTORECEPTION DEVICE WITH AN INSULATING RESIN MASS, AND METHOD FOR PRODUCING PHOTORECEPTION DEVICE

(71) Applicant: AOI Electronics Co., Ltd., Takamatsu-shi, Kagawa (JP)

(72) Inventor: Takahiro Ebisui, Takamatsu (JP)

(73) Assignee: AOI Electronics Co., Ltd., Takamatsu-shi (JP)

( * ) Notice: Subject to any disclaimer, the term of this patent is extended or adjusted under 35 U.S.C. 154(b) by 183 days.

(21) Appl. No.: 14/355,065

(22) PCT Filed: Oct. 31, 2012

(86) PCT No.: PCT/JP2012/078151
§ 371 (c)(1),
(2) Date: Apr. 29, 2014

(87) PCT Pub. No.: WO2013/065729
PCT Pub. Date: May 10, 2013

(65) Prior Publication Data
US 2014/0306094 A1 Oct. 16, 2014

(30) Foreign Application Priority Data
Oct. 31, 2011 (JP) ................. 2011-239192

(51) Int. Cl.
*G01J 1/04* (2006.01)
*H01L 31/0203* (2014.01)
(Continued)

(52) U.S. Cl.
CPC .......... *G01J 1/0403* (2013.01); *H01L 31/0203* (2013.01); *G01J 2001/0276* (2013.01);
(Continued)

(58) Field of Classification Search
CPC ....................... G01J 1/0403; G01J 2001/0276

USPC .......................................... 250/206; 257/680
See application file for complete search history.

(56) References Cited

U.S. PATENT DOCUMENTS

| 5,952,714 A | 9/1999 | Sano et al. |
| 7,939,901 B2 * | 5/2011 | Minamio .......... B29C 45/14418 257/433 |

(Continued)

FOREIGN PATENT DOCUMENTS

| CN | 100585880 C | 1/2010 |
| EP | 1 801 888 A1 | 6/2007 |

(Continued)

OTHER PUBLICATIONS

Extended European Search Report dated Jun. 26, 2015 (six (6) pages).

(Continued)

*Primary Examiner* — Seung C Sohn
(74) *Attorney, Agent, or Firm* — Crowell & Moring LLP

(57) ABSTRACT

A photoreception device includes: a substrate; a photoreceptor element including a photoreceptor portion upon an upper surface thereof and a lower surface thereof is mounted upon the substrate; and an insulating resin mass that contains a flat upper surface and an opening that exposes the photoreceptor portion of the photoreceptor element, that is formed upon the substrate to be thicker than thickness of the photoreceptor element, and that adheres closely against side surfaces of the photoreceptor element, the side surfaces surrounding the photoreceptor element. The insulating resin mass contains a step portion that is provided to a height between the flat upper surface thereof and the upper surface of the photoreceptor portion; and the step portion extends parallel to at least one pair of mutually opposed side surfaces of the photoreceptor element, at a periphery of the opening.

18 Claims, 14 Drawing Sheets

(51) Int. Cl.
*H01L 23/31* (2006.01)
*G01J 1/02* (2006.01)
(52) U.S. Cl.
CPC .. *H01L23/3121* (2013.01); *H01L 2224/48091* (2013.01); *H01L 2224/8592* (2013.01); *Y10T 29/49208* (2015.01)

(56) References Cited

U.S. PATENT DOCUMENTS

| | | | |
|---|---|---|---|
| 7,973,323 B2* | 7/2011 | Tanaka | H01L 23/24 257/433 |
| 8,153,467 B2* | 4/2012 | Yoneda | H01L 31/0203 257/434 |
| 2001/0052640 A1 | 12/2001 | Sekimoto | |
| 2003/0170933 A1 | 9/2003 | Manansala | |
| 2004/0058470 A1 | 3/2004 | Canella | |
| 2005/0006739 A1 | 1/2005 | Howard et al. | |
| 2005/0077451 A1 | 4/2005 | Minamio | |
| 2007/0176274 A1* | 8/2007 | Yoneda | H01L 23/3185 257/680 |
| 2009/0032684 A1 | 2/2009 | Minamio | |
| 2009/0166784 A1 | 7/2009 | Honda | |
| 2011/0101484 A1 | 5/2011 | Shiraishi et al. | |

FOREIGN PATENT DOCUMENTS

| | | |
|---|---|---|
| JP | 2001-257330 A | 9/2001 |
| JP | 2004-6689 A | 1/2004 |
| JP | 2004-247611 A | 9/2004 |
| JP | 2005-5363 A | 1/2005 |
| JP | 4200463 B2 | 12/2008 |
| JP | 2010-206028 A | 9/2010 |
| KR | 10-0790325 B1 | 1/2008 |
| KR | 10-2009-0038490 A | 4/2009 |
| TW | 495934 | 7/2002 |
| TW | 200514228 A | 4/2005 |
| TW | 200709406 A | 3/2007 |
| TW | 201007933 A1 | 2/2010 |

OTHER PUBLICATIONS

International Search Report including English translation dated Feb. 5, 2013 (Four (4) pages).

English translation of Korean Office Action issued in counterpart Korean Application No. 10-2014-7011248 dated Oct. 21, 2015 (Two (2) pages).

* cited by examiner (a)

(b)

(a)

(b)

(a)

(b)

PHOTORECEPTION DEVICE WITH AN INSULATING RESIN MASS, AND METHOD FOR PRODUCING PHOTORECEPTION DEVICE

TECHNICAL FIELD

The present invention relates to a photoreception device and to a method for producing a photoreception device, in which a photoreceptor element is packaged with an insulating resin mass.

BACKGROUND ART

An optical head that reads information recorded upon an optical disk such as a CD or a DVD or the like houses a photoreception device in its interior. In this type of photoreception device, a photoreceptor element is mounted upon a substrate, and includes a photoreceptor portion that receives light of wavelength from about 400 nm to 780 nm reflected from the optical disk upon a light receiving surface. The entire light reception surface side of the photoreceptor element is covered over with an insulating resin mass. And, as a method of manufacturing or producing a photoreception device having this construction, a method is per se known in which an electrode pad of the photoreceptor element and a connection pad of the substrate are wire bonded together, the photoreceptor element and the substrate are installed into a die, and dicing is performed after an insulating resin mass has been charged into the die (refer to Patent Literature #1).

When the entire light reception surface side of the photoreceptor element is covered over with an insulating resin mass, along with it being necessary to form the insulating resin mass from a transparent material, which is expensive, also dirt or dust in the air may accumulate upon the upper surface of the insulating resin mass, and light that ought to arrive at the photoreceptor portion of the photoreceptor element may be intercepted by this accumulated dirt or dust. Thus, a construction is per se known in which an opening is provided in the insulating resin mass at a position corresponding to the photoreceptor portion of the photoreceptor element (refer to Patent Literature #2).

CITATION LIST

Patent Literature

Patent Literature #1: Japanese Laid-Open Patent Publication No. 2005-5363.
Patent Literature #2: Japanese Patent No. 4200463.

SUMMARY OF INVENTION

Technical Problem

Since this method for producing a photoreception device described in Patent Literature #1 is a method that utilizes a die, accordingly the cost of production of the die increases the overall cost. Moreover, no method for producing a photoreception device is described in Patent Literature #2, and accordingly this reference suggests no new manufacturing method for manufacturing a photoreception device at a lower price.

Solution to Technical Problem

According to the 1st aspect of the present invention, a photoreception device comprises: a substrate; a photoreceptor element including a photoreceptor portion upon an upper surface thereof and a lower surface thereof is mounted upon the substrate; and an insulating resin mass that contains a flat upper surface and an opening that exposes the photoreceptor portion of the photoreceptor element, that is formed upon the substrate to be thicker than thickness of the photoreceptor element, and that adheres closely against side surfaces of the photoreceptor element, the side surfaces surrounding the photoreceptor element. The insulating resin mass contains a step portion that is provided to a height between the flat upper surface thereof and the upper surface of the photoreceptor portion; and the step portion extends parallel to at least one pair of mutually opposed side surfaces of the photoreceptor element, at a periphery of the opening.

According to the 2nd aspect of the present invention, in the photoreception device according to the 1st aspect, it is preferred that an area of the opening of the insulating resin mass is greater than an area of the photoreceptor element; and the upper surface of the photoreceptor element is entirely exposed through the opening.

According to the 3rd aspect of the present invention, in the photoreception device according to the 2nd aspect, it is preferred that a thickness of a portion where the insulating resin mass closely adheres to the side surfaces surrounding the photoreceptor element is substantially equal to the thickness of the photoreception device.

According to the 4th aspect of the present invention, in the photoreception device according to the 3rd aspect, it is preferred that the photoreception device further comprises a plurality of wires that respectively connect a plurality of input and output terminals of the photoreception device with a plurality of connection terminals provided upon the substrate. A portion of each of the plurality of wires positioned above the upper surface of the photoreceptor element is exposed from the insulating resin mass.

According to the 5th aspect of the present invention, in the photoreception device according to the 4th aspect, it is preferred that the plurality of wires are arranged along the at least one pair of mutually opposed side surfaces of the photoreceptor element.

According to the 6th aspect of the present invention, in the photoreception device according to any one of the 1st through the 5th aspects, it is preferred that the photoreceptor element has a rectangular shape; the insulating resin mass is formed to be thicker than the thickness of the photoreceptor element at positions where the step portion corresponding to two mutually opposed pairs of side surfaces of the photoreceptor element is provided; the opening is formed in a rectangular shape; and the step portion is formed around an entire peripheral portion of the opening.

According to the 7th aspect of the present invention, in the photoreception device according to any one of the 1st through the 5th aspects, it is preferred that the photoreceptor element has a rectangular shape; the insulating resin mass is formed to be thicker than the thickness of the photoreceptor element at positions where the step portion corresponding to a mutually opposed pair of side surfaces of the photoreceptor element is provided; and the opening extends parallel to the mutually opposed pair of side surfaces, and communicates to the exterior at one side end of the opening and at the other side end thereof.

According to the 8th aspect of the present invention, in the photoreception device according to the 7th aspect, it is preferred that the insulating resin mass covers an edge region of the upper surface of the photoreceptor element in a state in which the photoreceptor portion of the photoreceptor element is exposed through the opening.

According to the 9th aspect of the present invention, in the photoreception device according to any one of the 1st through the 8th aspects, it is preferred that a translucent member is adhered to the step portion.

According to the 10th aspect of the present invention, in the photoreception device according to the 9th aspect, it is preferred that the translucent member is one of an infra-red radiation filter, a band pass filter, and a reflection prevention film.

According to the 11th aspect of the present invention, in the photoreception device according to any one of the 1st through the 10th aspects, it is preferred that the insulating resin mass contains at least one notch that is generated by depressing a portion of the flat upper surface.

According to the 12th aspect of the present invention, in the photoreception device according to the 11th aspect, it is preferred that the at least one notch is a plurality of notches which are formed to match to positions of convex portions with which the plurality of notches are to mate, the convex portions being upon another member.

According to the 13th aspect of the present invention, a method for producing a photoreception device comprises: mounting a photoreceptor element upon a substrate that contains a plurality of connection terminals, the photoreceptor element containing a photoreceptor portion and a plurality of input and output terminals; connecting the plurality of connection terminals and the plurality of input and output terminals to each other respectively by connection members; applying an insulating resin material mass upon the substrate along a periphery of the photoreceptor element; along with pushing the insulating resin material mass that has been applied upon the substrate toward the substrate with a mask containing an opening of greater width than width of the photoreceptor element and upon which a damming projection is formed that projects out toward the photoreceptor element along at least one pair of mutually opposed side edges of the opening, pressing and spreading out the insulating resin material mass toward the photoreceptor element by the damming projection; and forming an insulating resin mass by applying heat to and hardening the insulating resin material mass.

According to the 14th aspect of the present invention, in the method for producing a photoreception device according to the 13th aspect, it is preferred that, when pressing and spreading out the insulating resin material mass towards the photoreceptor element, the insulating resin mass is applied around the damming projection of the mask.

According to the 15th aspect of the present invention, in the method for producing a photoreception device according to the 14th aspect, it is preferred that the mask includes a pressure portion positioned more toward an external periphery of the mask than the damming projection, a height of the pressure portion being greater than a height of the damming projection; and, when pressing the insulating resin material mass toward the substrate with the mask, the mask is pushed until a lower surface of the pressure portion contacts against an upper surface of the substrate.

According to the 16th aspect of the present invention, in the method for producing a photoreception device according to the 15th aspect, it is preferred that, when pressing the insulating resin material mass toward the substrate with the mask, a flow of the insulating resin material mass is dammed up with the side surfaces of the photoreceptor element, so that a step portion of the insulating resin material mass is formed in a periphery of the side surfaces, a thickness of the step portion being substantially equal to a thickness of the photoreceptor element.

According to the 17th aspect of the present invention, in the method for producing a photoreception device according to any one of the 13th through 16th aspects, it is preferred that the mask includes a projecting portion in a region that corresponds to a periphery of the photoreceptor element; and, when pressing the insulating resin material mass toward the substrate with the mask, a notch is formed at a portion of a flat upper surface of the insulating resin material mass, the portion of the flat upper surface corresponding to the lower surface of the projecting portion.

According to the 18th aspect of the present invention, in the method for producing a photoreception device according to any one of the 13th through 17th aspects, it is preferred that, when mounting the photoreceptor element upon the substrate, another photoreceptor element is mounted upon the substrate adjacent to the photoreceptor element; when pressing the insulating resin material mass that has been applied around the periphery of the photoreceptor element toward the substrate with the mask, an insulating resin material mass that has been applied around a periphery of the another photoreceptor element is pressed toward the substrate with the mask; and, after having formed the insulating resin masses by applying the heat to and hardening the insulating resin material mass, the photoreceptor element and the another photoreceptor element are obtained by cutting up the substrate and the insulating resin masses.

According to the 19th aspect of the present invention, in the method for producing a photoreception device according to any one of the 13th through the 18th aspects, it is preferred that a viscosity of the insulating resin material mass is from 200 to 350 Pa·s.

According to the 20th aspect of the present invention, in the method for producing a photoreception device according to any one of the 13th through the 18th aspects, it is preferred that a translucent member that includes one of an infra-red radiation filter, a band pass filter, or a reflection prevention film is adhered to the step portion of the insulating resin mass.

Advantageous Effects of Invention

According to this invention it is possible to obtain a photoreception device without using any die that would be high in price, since the insulating resin material mass is applied and this insulating resin mass is pressed and spread out by the mask that has the damming up projection, so that the upper surface of the photoreceptor element along the periphery of the photoreceptor portion is covered.

DESCRIPTION OF EMBODIMENTS

First Embodiment

In the following, a photoreception device according to a first embodiment of the present invention will be explained with reference to the drawings.

(Construction of the Photoreception Device)

Figure 1:
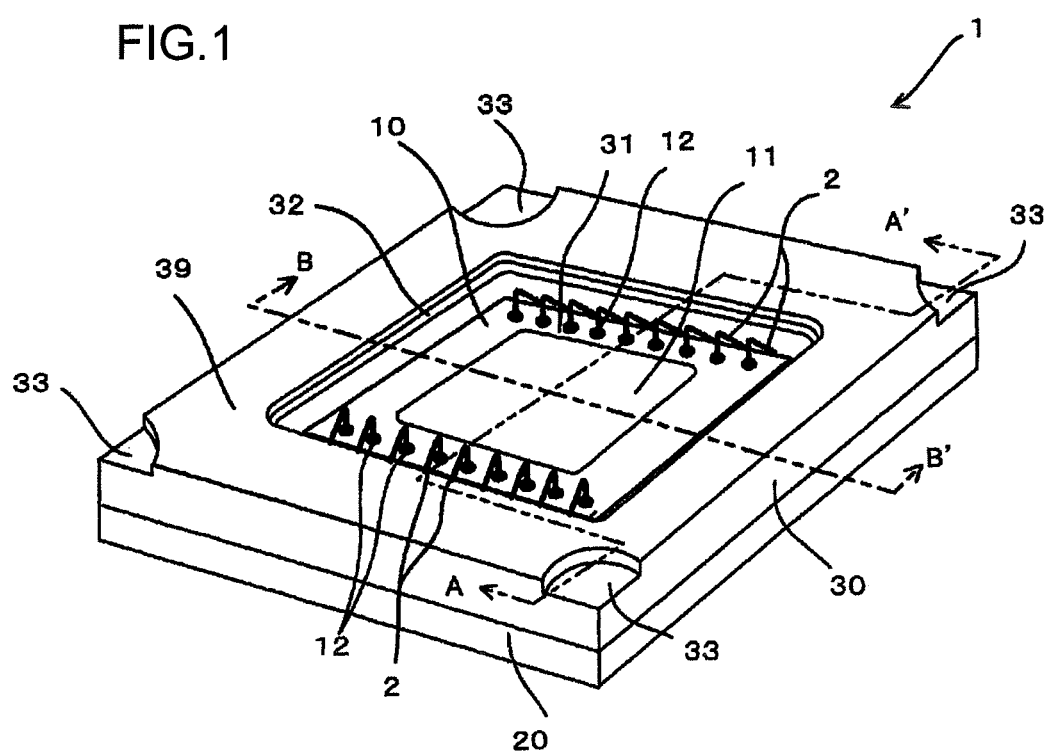
FIG. 1 is an enlarged perspective view showing the external appearance of a photoreception device according to a first embodiment of the present invention.

FIG. 1 is an enlarged perspective view showing the external appearance of a photoreception device according to a first embodiment of the present invention, FIG. 2(a) is a sectional view along a line A-A' in FIG. 1, and FIG. 2(b) is a sectional view along a line B-B' in FIG. 1. This photoreception device 1 includes a photoreceptor element 10, a substrate 20, connecting wires 2 that electrically connect together the photoreceptor element 10 and the substrate 20, and an insulating resin mass 30.

The photoreceptor element 10 is a semiconductor chip that has a photoreceptor portion 11 on its upper surface. The planar shape of the photoreceptor element 10 is rectangular, and, at the periphery of the photoreceptor portion 11 upon the upper surface of the photoreceptor element 10, a plurality of input and output terminals 12 are arranged along a pair of mutually opposed side surfaces of the photoreceptor element 10.

The substrate 20 is made from an insulating resin such as glass epoxy resin or the like, and has a rectangular shape whose size is greater than that of the external shape of the photoreceptor element 10. The photoreceptor element 10 is mounted in the central portion of the substrate 20, or almost in its central portion. And a plurality of connection terminals 21 are arranged upon the substrate 20, near the periphery of the photoreceptor element 10. The input and output terminals 12 of the photoreceptor element 10 and the connection terminals 21 of the substrate 20 are mutually connected together by the wires 2. In other words, the two end portions of the wires 2 are connected by wire bonding to the input and output terminals 12, and to the connection terminals 21. As shown in FIG. 1, in this embodiment, the wires 2 are arranged along one of the two pairs of mutually opposed side surfaces of the photoreceptor element 10 that is rectangular in shape.

The insulating resin mass 30 has an external rectangular shape that is the same size as the substrate 20, and is made from a thermosetting resin material such as epoxy resin or the like. While this insulating resin mass 30 is non transparent, it would make no difference if it were transparent. The insulating resin mass 30 is formed to be thicker than the thickness of the photoreceptor element 10, and has a flat upper surface 39. The input and output terminals 12, the connection terminals 21, and portions of the wires 2 are embedded in the insulating resin mass 30. The insulating resin mass 30 closely adheres to the entire side surface of the photoreceptor element 10 that surrounds the photoreceptor element 10, and covers the periphery of the photoreceptor element 10. An opening 31 is formed in the central portion of the insulating resin mass 30, and has a rectangular shape whose planar size is a little larger than that of the photoreceptor portion 11 of the photoreceptor element 10. Thus, the entire photoreceptor portion 11 of the photoreceptor element 10 is exposed to the exterior through this opening 31. Moreover, a step portion 32 is formed on the insulating resin mass 30, at the upper portion of the opening 31 and also around the entire peripheral portion of the opening 31. In other words, as shown in FIG. 1, the step portion 32 is provided along the entire periphery of the opening 31, at an intermediate position in the height direction between the flat upper surface 39 of the insulating resin mass 30 and the upper surface 10a of the photoreceptor element 10. This step portion 32 is formed at the periphery of the opening 31, corresponding to both the two pairs of mutually opposed side surfaces of the photoreceptor element 10, and extends parallel to those side surfaces. Thus, even within the step portion 32, the area of the opening portion 31 is larger than the area of the photoreceptor element 10.

At the positions that the step portion 32 corresponding to the two mutually opposed pairs of side surfaces of the photoreceptor element 10 is provided, the insulating resin mass 30 is formed to be thicker than the thickness of the photoreceptor element 10. At its intersection portion with the upper surface 10a of the photoreceptor element 10, the step portion 32 of the insulating resin mass 30 is formed in a circular arc shape, so that the thickness of the insulating resin mass 30 gradually decreases toward the upper surface 10a of the photoreceptor element 10 at the step portion 32 of the insulating resin mass 30, and, at the portion where the insulating resin mass 30 is closely adhered to the side surfaces of the photoreceptor element 10, the thickness of the insulating resin mass 30 is equal or substantially equal to the thickness of the photoreceptor element 10. Accordingly, as shown in FIG. 2(a), on each of the wires 2, its end portion that is joined to one of the input and output terminals 12 that are formed upon the upper surface of the photoreceptor element 10, and that is positioned above the upper surface of the photoreceptor element 10, is exposed from the insulating resin mass 30. The details of the method for manufacturing or producing the insulating resin mass 30 having this type of step portion 32 will be described hereinafter: without using any die, it is possible to manufacture or produce such an insulating resin mass 30 having such a step portion 32 in a cheap and also efficient manner.

Notches 33 are formed at the four corner portions on the external periphery of the insulating resin mass 30. These notches 33 have a depth that reaches an intermediate position in the thickness of the insulating resin mass 30. For example, the depth of the notches 33 may be arranged to be the same as the depth of the step portion 32, or to be substantially the same. The planar shape of the notches 33 is a quarter-circular arc shape (i.e. a sector shape). However, while in FIG. 1 the planar shape of the notches 33 is a circular arc shape, it would make no difference if it were to be a portion of an elliptical shape, or a portion of a polygonal shape.

As one example, the external dimensions of this photoreception device 1 may approximately be: length 3 to 5 mm; width 2.5 to 4.5 mm; and thickness 0.8 to 1.5 mm. However, the present invention is not to be considered as being limited by these dimensions.

(Method for Manufacturing or Producing this Photoreception Device)

Figure 2:
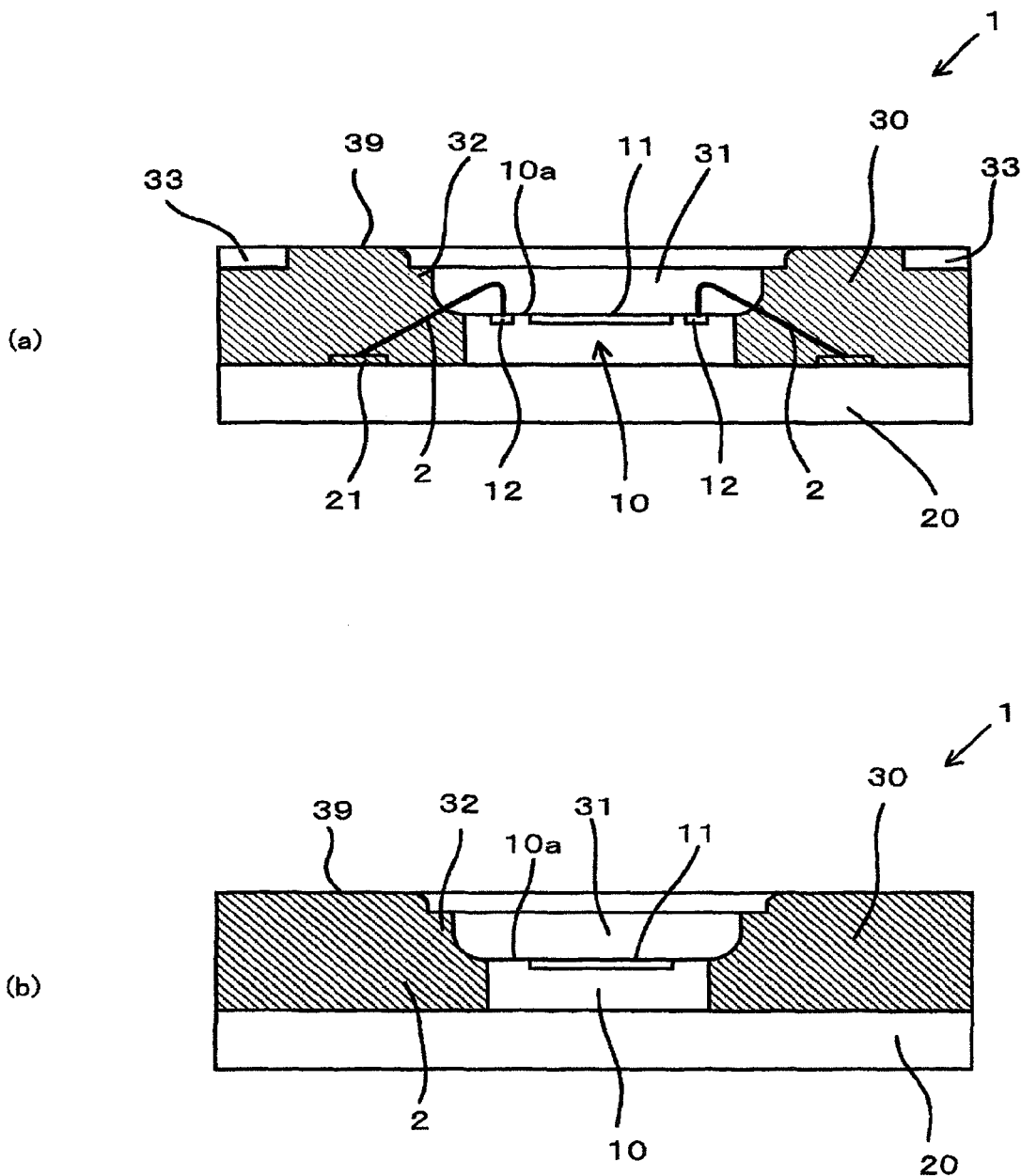
FIG. 2(a) is a sectional view along a line A-A' in FIG. 1.
FIG. 2(b) is a sectional view along a line B-B' in FIG. 1.

A method for manufacturing or producing this photoreception device 1 according to the first embodiment and shown in FIGS. 1 and 2 will now be explained with reference to FIGS. 3 through 7. FIGS. 3(a), 4(a), 5(a), 6(a), and 7(a) are sectional views when the photoreception device 1 has been cut along A-A' in FIG. 1, while FIGS. 3(b), 4(b), 5(b), 6(b), and 7(b) are sectional views when the photoreception device 1 has been cut along B-B' in FIG. 1. It should be understood that, as the method for manufacturing or producing the photoreception device 1, a method is used in which, by employing a substrate 20 whose area is large so that a large number of the photoreceptor elements 10 can be mounted upon the substrate 20, a large number of the photoreception devices 1 are obtained at once; but only a region in which a single one of these photoreception devices 1 is formed is shown in FIGS. 3 through 7.

First, the photoreceptor element 10, including the photoreceptor portion 11 and the plurality of input and output terminals 12, is mounted upon the substrate 20 upon which the plurality of connection terminals 21 are formed. The connection terminals 21 are arranged parallel to side surfaces of the photoreceptor element 10, at the outer sides of the photoreceptor element 10 along which the input and output terminals 12 are arranged. Since in this case, as described above the area of the substrate is large, it is possible to mount a large number of the photoreceptor elements 10 upon the substrate 20, with this large number of photoreceptor elements 10 being arranged in the form of a matrix upon this substrate 20 whose area is large. In other words, along with one photoreceptor element 10 that is mounted upon the substrate 20, other photoreceptor elements 10 adjacent to this photoreceptor element 10 are also mounted upon the substrate 20. According to requirements, these photoreceptor elements 10 are die bonded to the substrate 20.

Figure 3:
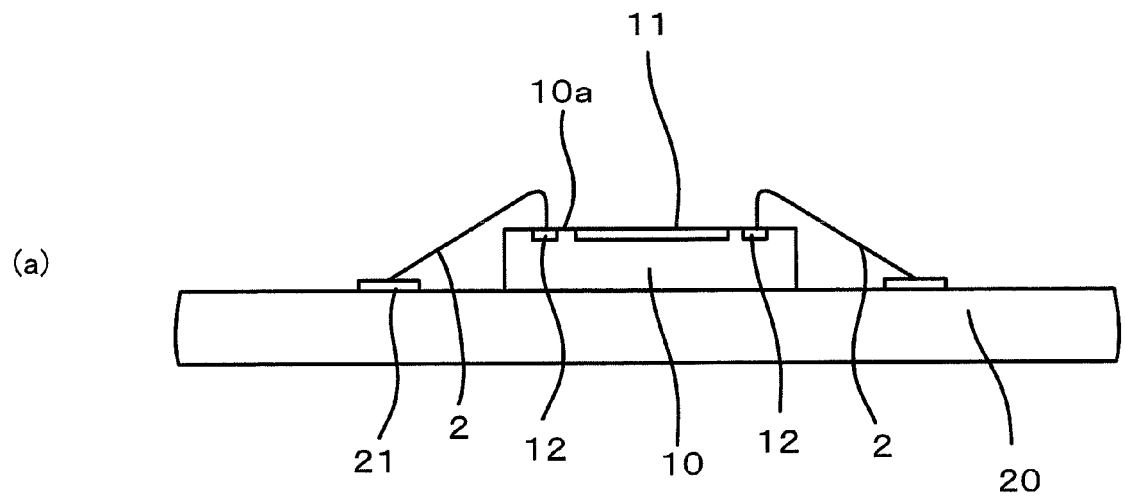
FIGS. 3(a) and 3(b) are both figures for explanation of a first embodiment of a method for manufacturing or producing the photoreception device shown in FIG. 1, and are sectional views related to a first process.
Figure 3:
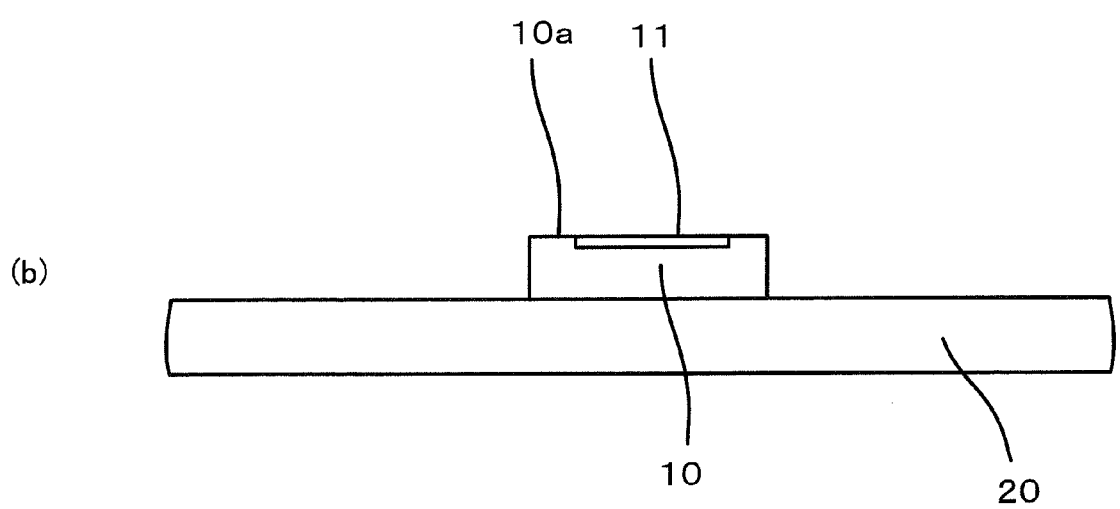

And, as shown in FIG. 3, by the wires 2, which are made from gold or the like, being bonded the input and output terminals 12 of the photoreceptor element 10 and to the connection terminals 21 of the substrate 20, these terminals 12 and 21 are connected to each other.

Figure 4:
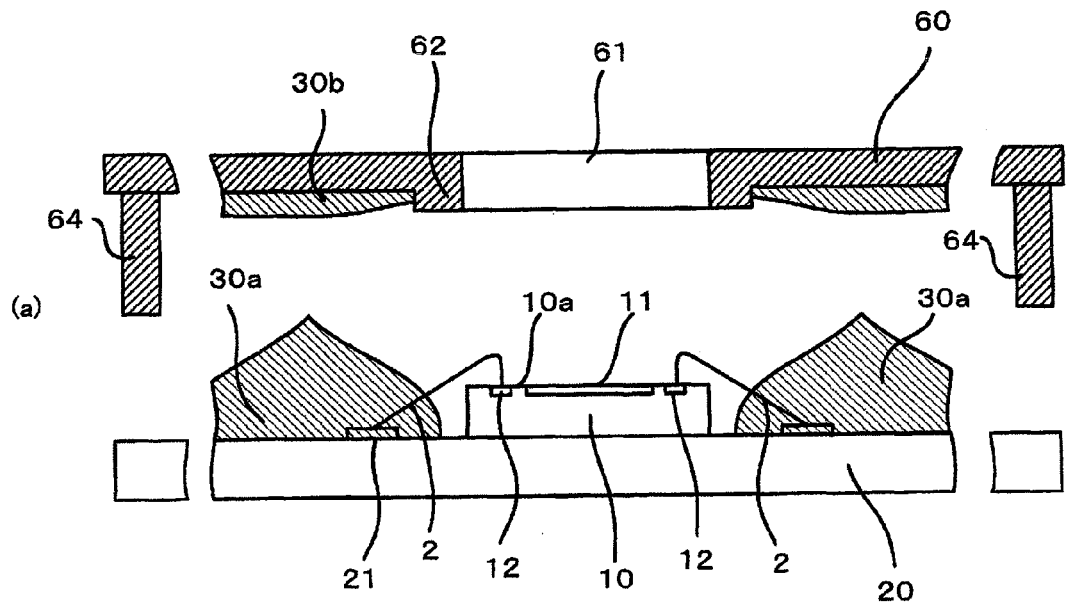
FIG. 4 is a sectional view for explanation of a process following that of FIG. 3.
Figure 4:
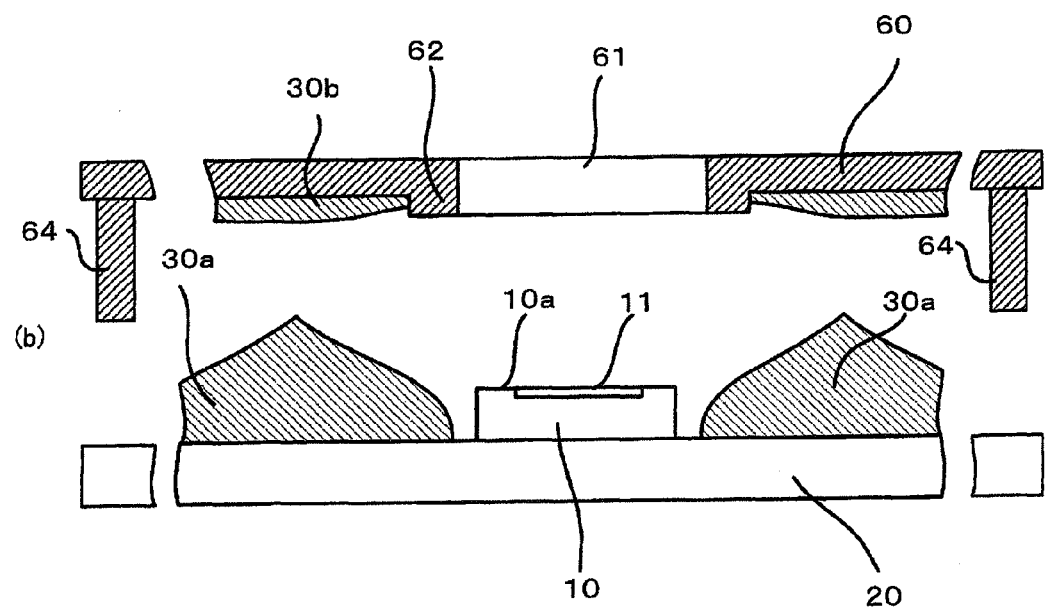

Next, as shown in FIG. 4, an insulating resin material mass 30a made from a quantity of thermosetting resin such as, for example, epoxy resin or the like, is applied upon the substrate 20 where it is exposed from between the plurality of photoreceptor elements 10 that are arranged in the form of a matrix. In other words, along with the insulating resin material mass 30a being applied upon the substrate 20 around the periphery of one photoreceptor element 10, the insulating resin material mass 30a is also applied upon the substrate 10 around the peripheries of the other photoreceptor elements 10 that are adjacent to this photoreceptor element 10. It is desirable for the viscosity of this insulating resin material mass 30a to be around 200 to 350 Pa·s, and the insulating resin material mass 30a may be applied using a dispenser or a brush. In this case, the insulating resin material mass 30a is applied upon the substrate 20 around the peripheries of the photoreceptor elements 10, while care is taken in order to ensure that it should not be applied over the photoreceptor elements 10.

Next, a mask 60 upon which another insulating resin material mass 30b has been applied is disposed upon the substrate 20 to which the insulating resin material mass 30a has been applied. This insulating resin material mass 30b is made from the same material as the insulating resin material mass 30a.

Figure 8:
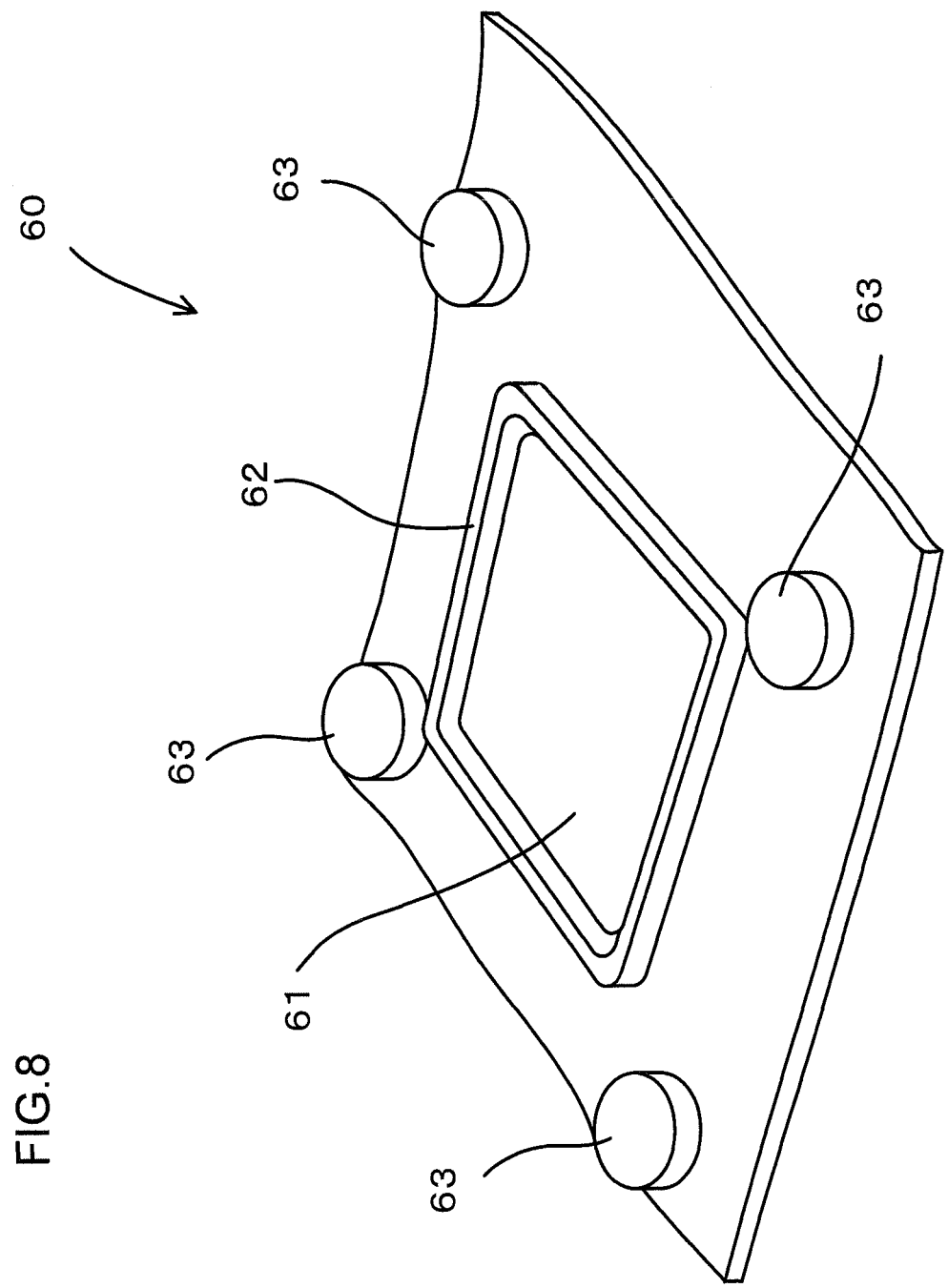
FIG. 8 is a perspective view showing the external appearance of a mask in the first embodiment, this mask being used for manufacture or production of the photoreception device shown in FIG. 1.

FIG. 8 is a perspective view of the mask 60 as seen from the side of the substrate 20. This mask 60 is made from a metal such as stainless steel or the like, so that it is possible for the mask 60 to be used repeatedly. An opening 61 is formed in the mask 60, and has a rectangular shape that is larger than the external shape of the photoreceptor element 10. A damming projection 62 is formed upon two pairs of mutually opposed side edges of the opening 61, and projects out toward the side where the substrate 20 will be. This damming projection 62 is formed around the entire periphery of the edge of the opening 61. Moreover, four projecting portions 63 are formed upon the mask 60, for forming the notches 33 of the photoreception device 1 shown in FIG. 1. These projecting portions 63 are shaped as short cylinders, with the height of each of the projecting portions 63 being less than the thickness of the insulating resin mass 30; for example, they may be of the same height as the height of the damming projection 62, or of substantially the same height. Each of the projecting portions 63 is formed exterior to the damming projection 62, at a location on the mask 60 that corresponds to the periphery of the photoreceptor element 10.

The large number of openings 61 in the mask 60, and the projecting portions 63 formed around the peripheries of these openings 61, are all arranged in the form of a matrix. And, although this feature is not shown in this figure, at the edge portions near the external periphery of the mask 60, tubular pressure portions 64 arranged with predetermined gaps between them along the outer periphery of the mask 60 are formed. The thickness of the insulating resin mass 30 described above is determined by the height of these pressure portions 64, and becomes the same or substantially the same as this height.

As shown in FIG. 4, the insulating resin material mass 30b is applied thinly to the surface of the mask 60 at the side facing the photoreceptor element 10, upon the periphery around the exterior of the damming projection 62. This insulating resin material mass 30b is not absolutely necessary; it would be acceptable for it to be omitted. And positional determination of the mask 60 upon the substrate 20 is performed, so that the photoreceptor elements 10 that are arranged upon the substrate 20 come to be located within the openings 61 of the mask 60.

Figure 5:
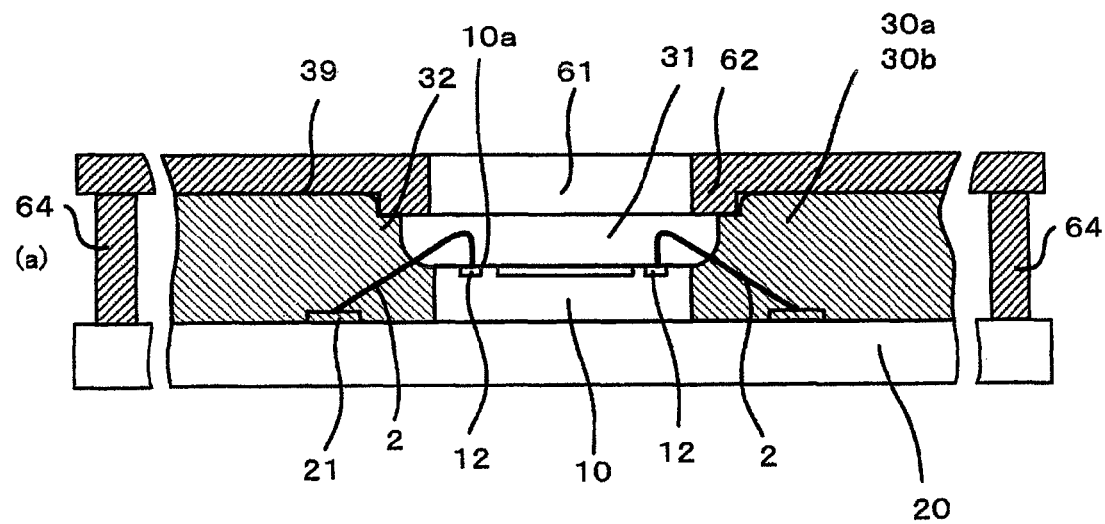
FIG. 5 is a sectional view for explanation of a process following that of FIG. 4.
Figure 5:
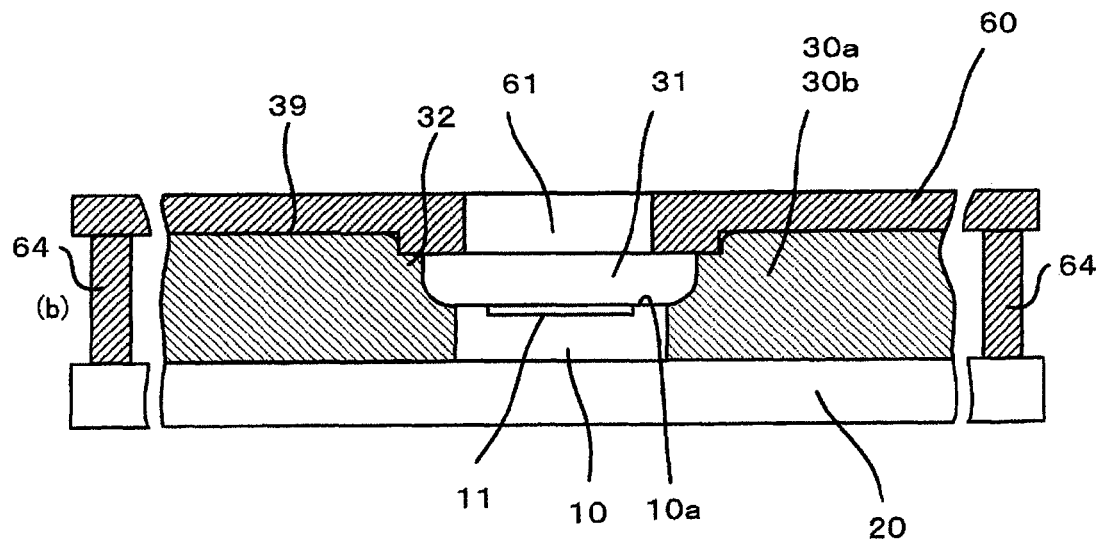

Next, the mask 60 is pressed toward the substrate 20, and the mask 60 is pressed down until the lower surfaces of the pressure portions 64 that are arranged at the edge portions of the mask 60 near its external periphery are contacted against the upper surface of the substrate 20. This state is shown in FIG. 5. The pressure portions 64 are positioned more toward the external periphery than the damming projections 62. And the height of the pressure portions 64 is greater than the height of the damming portions 62. Along with the insulating resin material mass 30a that was applied upon the substrate 20 around the periphery of the one photoreceptor element 10, being pressed down toward the substrate 20 by the mask 60, also the insulating resin material masses 30a that were applied upon the substrate 20 around the peripheries of the other photoreceptor elements 10 that are adjacent to that photoreceptor element 10, are pressed toward the substrate 20 by the mask 60.

Due to the mask 60 being pressed toward the substrate 20, the insulating resin material mass 30b that was applied to the mask 60 and also the insulating resin material mass 30a that was applied upon the substrate 20 become united together and are pressed and spread out towards the photoreceptor element 10. At the upper portion, in other words near the side toward the mask 60, the flow of the insulating resin material masses 30a and 30b is regulated by the damming projection 62, and thereby the step portion 32 is formed. Here, if the flow of the insulating resin material masses 30a and 30b were not to be regulated by the damming projection 62, then the insulating resin material masses 30a and 30b would be flashed out through the opening 61, and this would not be desirable. In other words, the damming projection 62 serves the function of preventing flashing.

Moreover, at its lower side, in other words at its side near the substrate 20, the flow of the insulating resin material mass 30a stops in a state in which the insulating resin material mass 30a is closely adhered to the side surfaces of the photoreceptor element 10. In this state, the end portions of the wires 2 connected to the input and output terminals 12 that are formed on the upper surface 10a of the photoreceptor element 10 remain exposed from the insulating resin mass 30.

The opening 61 of the mask 60 serves the function of venting to the exterior gas such as air or the like mixed in the insulating resin material mass 30a and 30b.

Since the flow of the insulating resin material mass 30a is dammed up by the side surfaces of the photoreceptor element 10 in this manner, so that the flow of the insulating resin material mass 30a is stopped at these positions, accordingly there is no effect of the insulating resin material mass 30a being pressed and spread out upon the upper surface 10a of the photoreceptor element 10. In the prior art, it is per se known to adopt resin flow prevention measures in order to prevent the insulating resin material mass 30a from flowing upon the photoreceptor portion 11 of the photoreceptor element 10. However, by damming up the insulating resin material mass 30a with the side surfaces of the photoreceptor element 10 as is performed with the photoreception device 1 of this embodiment, it becomes possible to omit the adoption of any countermeasures such as those provided in the prior art. Due to this, it is possible to reduce the number of processes. Moreover the advantageous effect is obtained that it is possible to make the photoreception device 1 more compact, since the flow of the insulating resin material mass 30a is stabilized and variations in the volume of the flow of the insulating resin material mass 30a are reduced, due to the fact that there is no flowing of the insulating resin material mass 30a to the upper surface 10a of the photoreceptor element 10.

Since, when the mask 60 is pressed toward the substrate 20 and the lower surfaces of the pressure portions 64 of the mask 60 are contacted against the upper surface of the substrate 20, the insulating resin material masses 30a and 30b at the portions that correspond to the projecting portions 63 of the mask 60 are pressed by the projecting portions 63 of the mask 60, accordingly portions of the flat upper surface 39 become depressed, and the portions that are generated due to this depression are formed into cylindrical empty spaces that correspond to the four notches 33.

Next, the insulating resin mass 30 is formed by applying heat to the insulating resin material masses 30a and 30b and hardening them. And the mask 60 that is disposed above this insulating resin mass 30 is detached. In this state, the opening 31 that corresponds to the photoreceptor portion 11 of the photoreceptor element 10 is formed in the insulating resin mass 30, and the step portion 32 is formed in the peripheral part of the opening 31 around its entire periphery. Moreover, the notches 33 are formed at the portions of the insulating resin mass 30 that correspond to the projecting portions 63 of the mask 60, so as to have a depth that reaches an intermediate position of the thickness of the resin mass 30.

Figure 6:
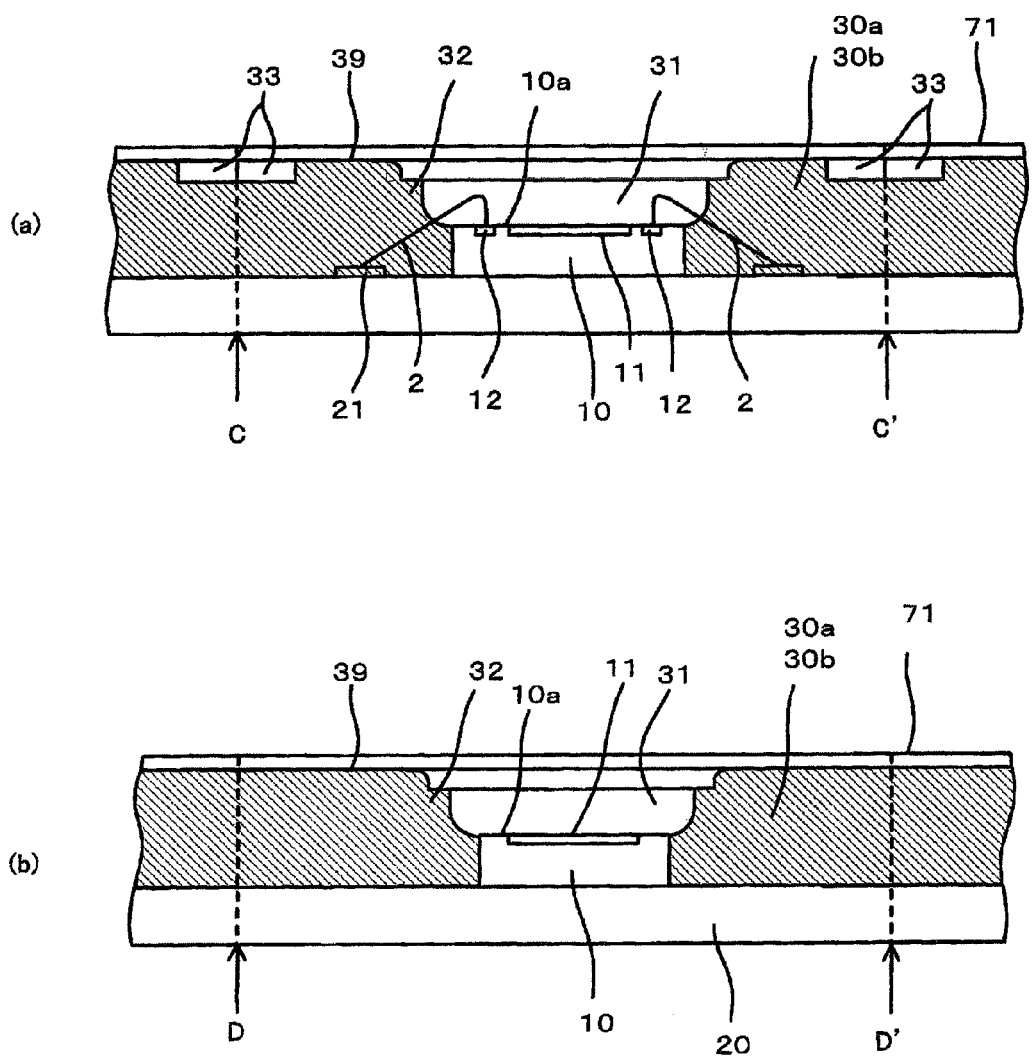
FIG. 6 is a sectional view for explanation of a process following that of FIG. 5.

Next, a protective sheet 71 is adhered over the entire surface of the insulating resin mass 30. This protective sheet 71 has an adhesive layer that can be detached. This state is shown in FIG. 6.

Figure 7:
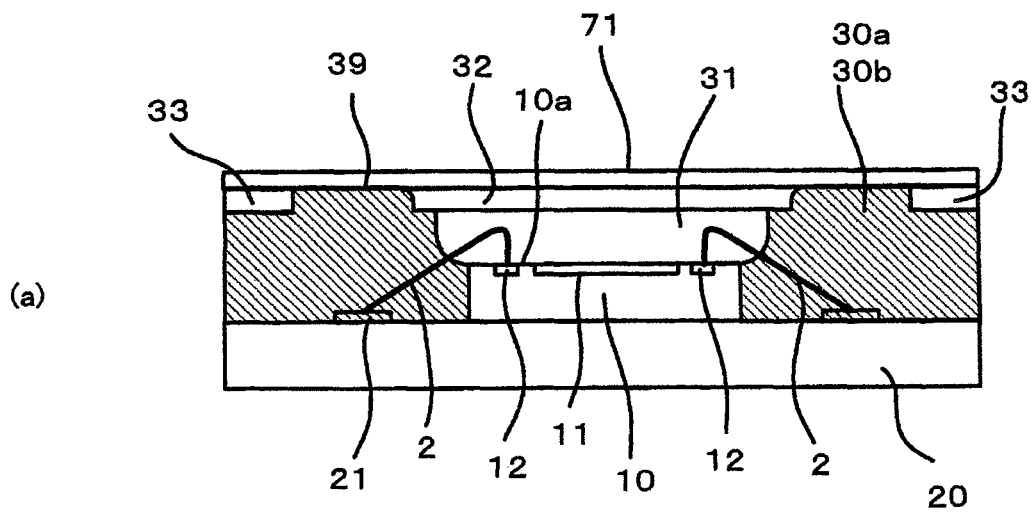
FIG. 7 is a sectional view for explanation of a process following that of FIG. 6.
Figure 7:
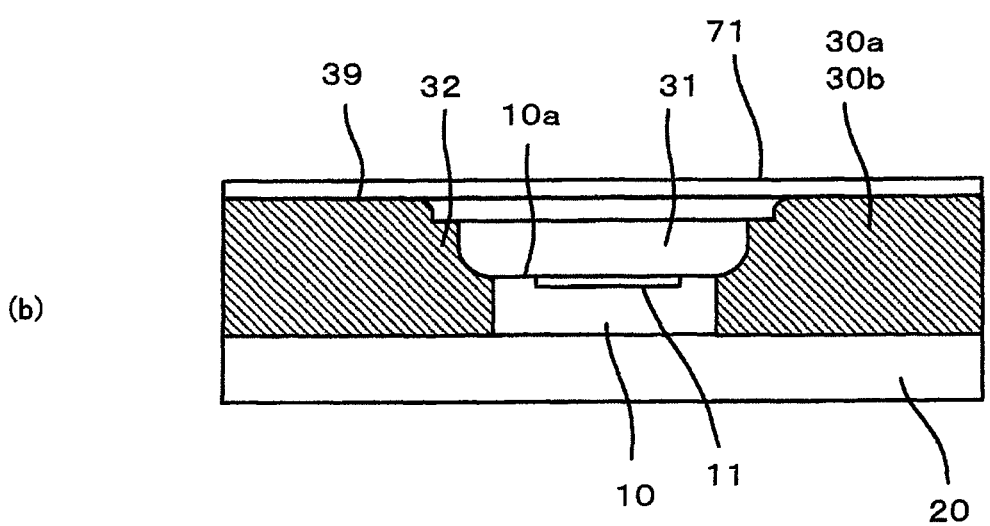

And next, the substrate 20, the insulating resin mass 30, and the protective sheet 71 are cut up, so that a large number of photoreception devices 1 are obtained. When the substrate 20, the insulating resin mass 30, and the protective sheet 71 are cut up, each of the cylindrical vacant spaces of the insulating resin mass 30 that have been formed corresponding to the projecting portions 63 of the mask 60 is divided up into four equal portions according to these cutting lines that pass through its axis. In FIG. 6, the cutting positions C, C' and D, D' show the position of such division of each vacant space into four equal portions, and the substrate 20 and the insulating resin mass 30 are disconnected along the broken lines at these cutting positions C, C' and D, D'. Due to this, a notch 33 having a shape of one quarter of a cylinder that has been divided into four equal parts is formed at each of the four corners of the insulating resin mass 30. This state is shown in FIG. 7.

Since the protective sheet 71 is a protective member that is adhered until the optical head is assembled, accordingly the photoreception device 1 shown in FIGS. 1, 2(a), and 2(b) is produced or manufactured by detaching the protective sheet 71 directly before the optical head is assembled. When the protective sheet 71 is to be detached, it is possible to perform detachment of the protective sheet 71 in a simple and easy manner, since it is possible to insert the end of tweezers into one of the notches 33 of the insulating resin mass 30.

(Beneficial Effects Provided According to this First Embodiment)

According to the photoreception device 1 of the first embodiment described above, the beneficial effects described below can be obtained.

(1) Since the insulating resin material mass 30a is applied upon the substrate 20, and the periphery of the photoreceptor element 10 is covered over by pressing and spreading out this insulating resin material mass 30a with the mask 60 that has the damming projection 62, accordingly it is possible to obtain this photoreception device 1 that has been packaged with the insulating resin mass 30 without using any high priced die.

(2) Since the opening 31 whose size is larger than that of the external shape of the photoreceptor element 10 is provided in the mask 60, and the damming projection 62 for damming up the flow of the insulating resin material masses 30a and 30b is formed at the peripheral portion of this opening 31, accordingly it is possible to form the step portion 32 in an efficient manner. Moreover, since the flow of the insulating resin material mass 30a is dammed up by the side surfaces of the photoreceptor element 10, and thereby the flow of the insulating resin material mass 30a is stabilized and variations in the volume of this flow are reduced, accordingly it is possible to make this photoreception device 1 more compact.

(3) It is arranged to form the notches 33 in the insulating resin mass 30 to have a depth that reaches an intermediate position in the thickness direction. Due to this, it is simple and easy to detach the protective sheet 71 that has been adhered on the insulating resin mass 30 by inserting the end of tweezers into one of the notches 33, so that the efficiency of production of the photoreception device 1 is enhanced.

(4) Since the mask 60 is made from a metal such as stainless steel or the like, accordingly it is possible to use the mask 60 repeatedly. With the prior art method in which the mask was made from a resin film, it was necessary to discard the mask after use, since, when heat was applied to the insulating resin material masses 30a and 30b to harden them, the mask was undesirably deformed by this heat. Thus it is possible to reduce the cost of manufacture or production of this photoreception device 1, as compared to the prior art.

Second Embodiment

Figure 9:
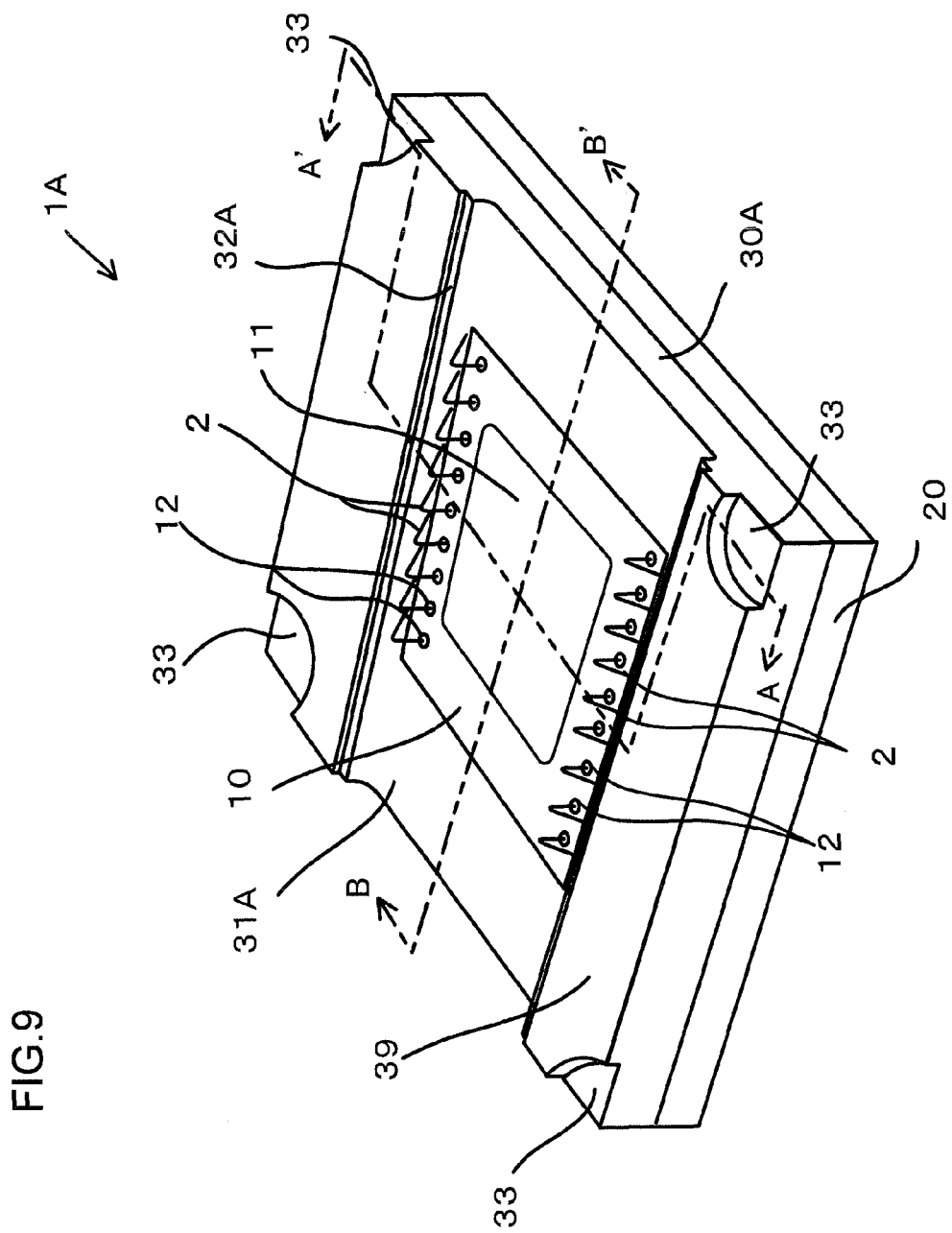
FIG. 9 is an enlarged perspective view showing the external appearance of a photoreception device according to a second embodiment.
Figure 10:
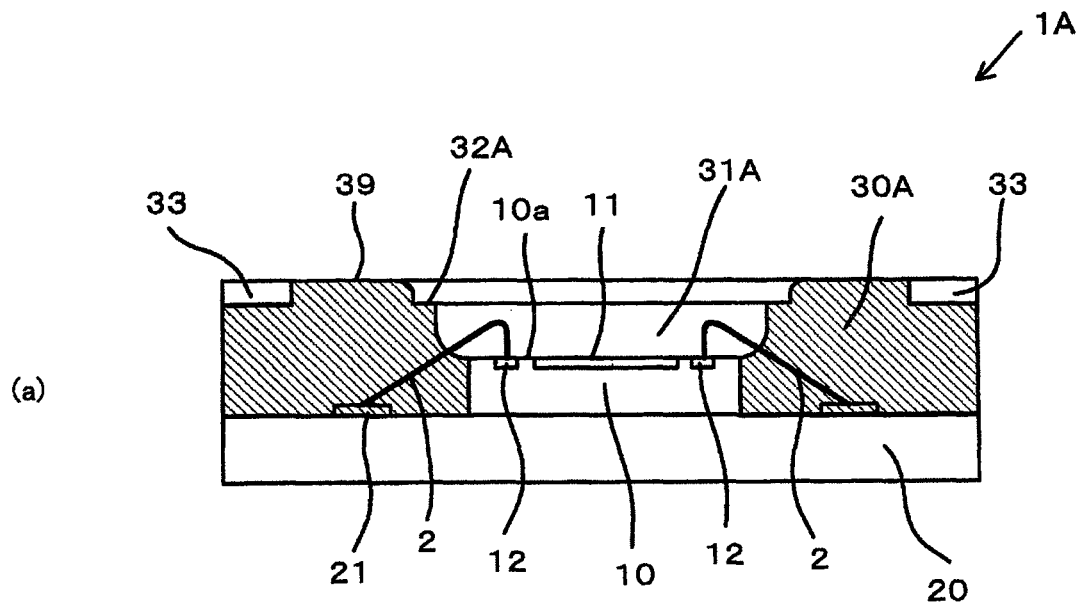
FIG. 10(a) is a sectional view along a line A-A' in FIG. 9.
FIG. 10(b) is a sectional view along a line B-B' in FIG. 9.
Figure 10:
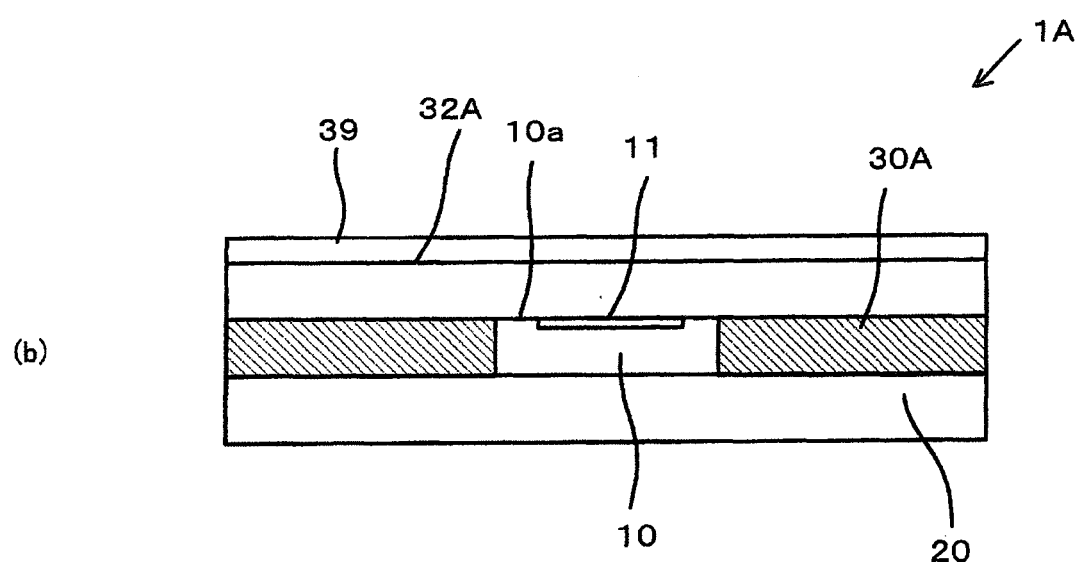

FIG. 9 is an enlarged perspective view showing the external appearance of a photoreception device according to a second embodiment of the present invention; FIG. 10(a) is a sectional view along a line A-A' in FIG. 9; and FIG. 10(b) is a sectional view along a line B-B' in FIG. 9. The feature of difference between the photoreception device 1A of this embodiment and the photoreception device 1 of the first embodiment is that the opening 31A of the insulating resin mass 30A penetrates from one side right through to the other side; or, to put it in another manner, that, both at one side of the opening 31A and at its other side, the opening 31A communicates or connects with the exterior of the photoreception device 1A.

In this embodiment, the step portion 32A is formed upon the periphery of the opening 31A so as to correspond to a pair of side surfaces along which the wires 2 are arranged, among the two pairs of mutually opposed side surfaces of the photoreceptor element 10 and extends parallel to the pair of side surfaces. And, as shown in FIG. 9 and FIG. 10(a), at the positions where the step portion 32A corresponding to the above described pair of side surfaces is formed, the insulating resin mass 30A is formed to be thicker than the thickness of the photoreceptor element 10. However, as shown in FIG. 9 and FIG. 10(b), the height of the insulating resin mass 30A where it contacts the other pair of side surfaces of the photoreceptor element 10 that are adjacent to the above described pair of side surfaces is equal or substantially equal to the thickness of the photoreceptor element 10. To put it in another manner, at the boundary region between the insulating resin mass 30A and the photoreceptor element 10, the upper surface of the insulating resin mass 30A and the upper surface 10a of the photoreceptor element 10 are positioned upon the same plane, or substantially upon the same plane.

The insulating resin mass 30A included in the photoreception device 1A of this embodiment is formed by pressing and spreading out the insulating resin material mass 30a using the mask 60, in a similar manner to the case with the insulating resin mass 30 included in the photoreception device 1 of the first embodiment. However, when forming this insulating resin mass 30A, a mask is used that has an opening having a width that is greater than the width of the photoreceptor element 11 and being longer than the length of the opening 31A, and that has damming up projections provided along a pair of mutually opposed side edges that extend along the longitudinal direction of this opening.

Apart from the structural features described above, the other structural features of the photoreception device 1A of this embodiment are the same as those in the photoreception device 1 of the first embodiment, and accordingly, to elements included in this photoreception device 1A that correspond to ones of the photoreception device 1, the same reference symbols are appended, and explanation of those elements will be omitted.

With this second embodiment as well, it is possible to obtain the same beneficial effects as in the case of the first embodiment. It should be understood that, in this second embodiment, the opening 31A of the insulating resin mass 30A penetrates from one side of the photoreceptor element 10A all the way through to its other side, so that, even though the protective sheet 71 is adhered to the upper surface of the insulating resin mass 30A, there is still a possibility of ingress of foreign matter through the gap between the protective sheet and the insulating resin mass 30A at both sides thereof. Accordingly, it would also be acceptable to arrange to omit providing the protective sheet 71 to the photoreception device 1A of this embodiment, and to manufacture or produce it in an environment and in manufacturing conditions or producing conditions and so on in which no ingress of foreign matter takes place. The manufacturing efficiency or the producing efficiency would be enhanced by omission of the protective sheet 71.

Third Embodiment

Figure 11:
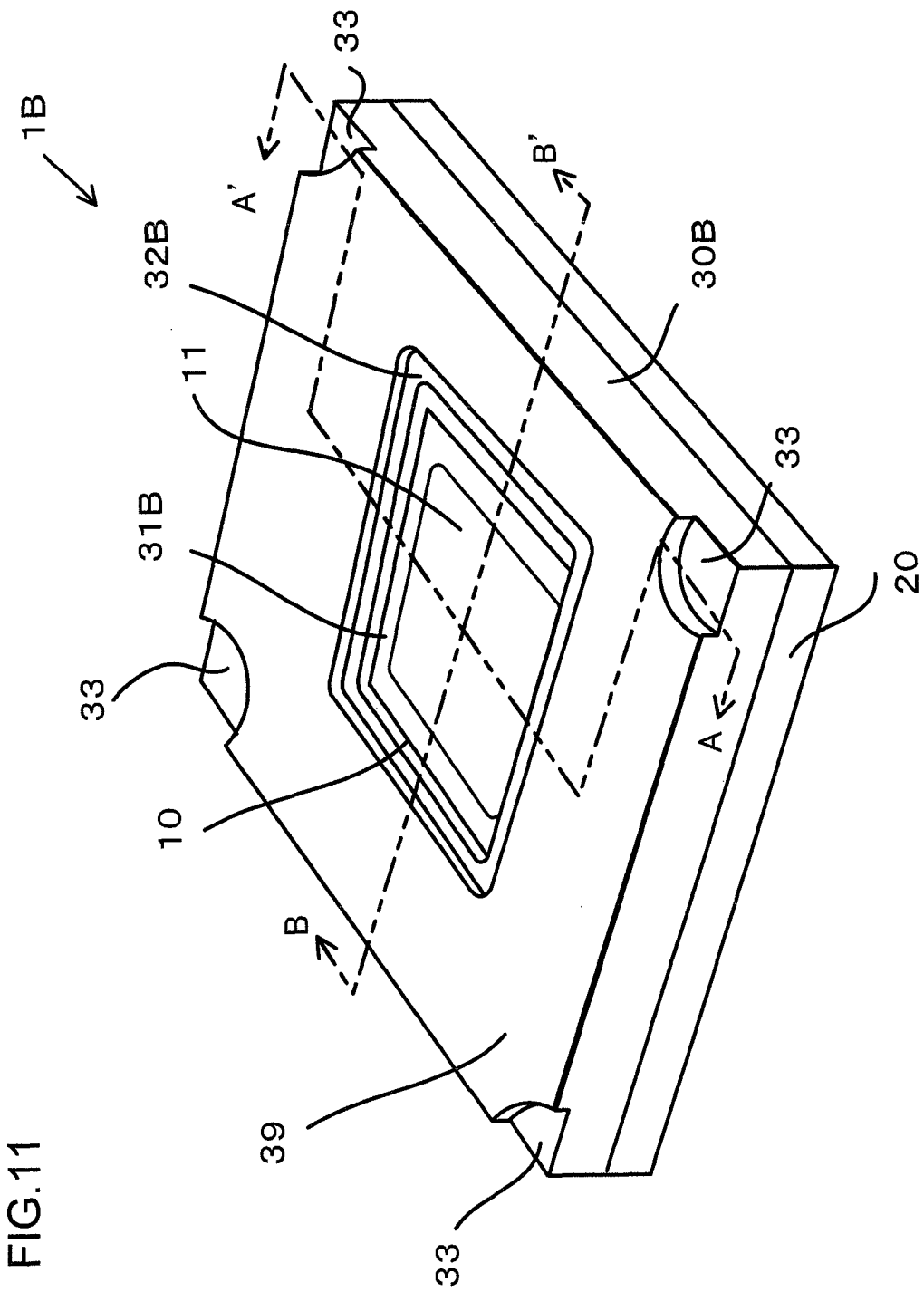
FIG. 11 is an enlarged perspective view showing the external appearance of a photoreception device according to a third embodiment.
Figure 12:
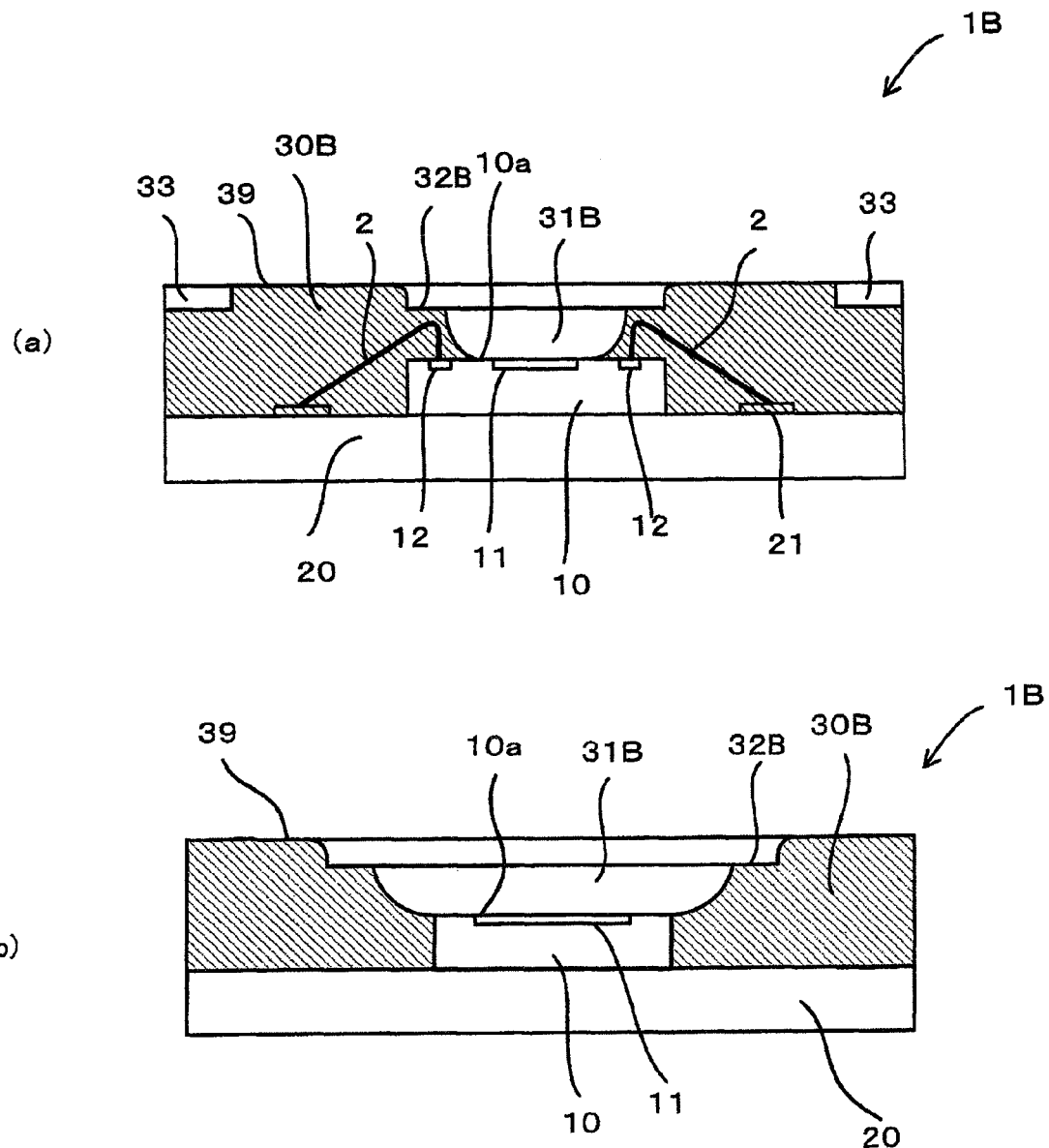
FIG. 12(a) is a sectional view along a line A-A' in FIG. 11.
FIG. 12(b) is a sectional view along a line B-B' in FIG. 11.

FIG. 11 is an enlarged perspective view showing the external appearance of a photoreception device according to a third embodiment of the present invention; FIG. 12(a) is a sectional view along a line A-A' in FIG. 11; and FIG. 12(b) is a sectional view along a line B-B' in FIG. 11. The feature of difference between the photoreception device 1B of this embodiment and the photoreception device 1 of the first embodiment is that it is arranged for the insulating resin mass 30B to cover the entire region of the wires 2.

As shown in FIG. 11 and FIG. 12(a), at one pair of mutually opposed side surfaces where the wires 2 are arranged, among the two pairs of mutually opposed side surfaces of the photoreceptor element 10, the insulating resin mass 30B projects out into the edge region of the upper surface 10a of the photoreceptor element 10. Since the portion of the insulating resin mass 3 that projects out over the upper surface 10a of the photoreceptor element 10 covers over the edge region of the upper surface 10a of the photoreceptor element 10, accordingly the portions where the wires 2 are joined to the connection terminals 21 become covered over, and, due to this, the entire region where the wires 2 are present is embedded in the insulating resin mass 30B.

Furthermore, as shown in FIG. 11 and FIG. 12(b), at the positions where the insulating resin mass 30B contacts a pair of mutually opposed side surfaces where the wires 2 are not arranged, among the two pairs of mutually opposed side surfaces of the photoreceptor element 10, the thickness of the insulating resin mass 30B is equal or substantially equal to the thickness of the photoreceptor element 10, in a similar manner to the case with the first embodiment.

The step portion 32B of the insulating resin mass 30B is formed to have a rectangular shape that, in both the width direction and the length direction of the photoreceptor element 10, is larger than the corresponding width and length of the photoreceptor element 10. In this case, at the step portion 32B of the insulating resin mass 30B, its dimension in the width direction of the photoreceptor element 10, or, to put it in another manner, its dimension between its two sides where the wires 2 are arranged, is formed to be shorter than the dimension of the photoreceptor element 10 in its length direction.

The opening 31B of the insulating resin mass 30B is formed in a rectangular shape, with the entire periphery of the opening 31B being disposed within the interior of the step portion 32B. In this case, at the opening 31B of the insulating resin mass 30B, its dimension in the width direction of the photoreceptor element 10, or, to put it in another manner, its dimension between its sides where the wires 2 are arranged, is formed to be shorter than the width of the photoreceptor element 10. Moreover, the dimension of the step portion 32B of the insulating resin mass 30B in the length direction of the photoreceptor element 10, or, to put it in another manner, its dimension between its sides where the wires 2 are not arranged, is formed to be longer than the dimension of the photoreceptor element 10 in the length direction. It should be understood that the photoreceptor portion 11 of the photoreceptor element 10 is in a state of being exposed through the opening 31B.

The insulating resin mass 30B may be formed in a similar manner to the insulating resin mass 30A of the photoreception device 1 of the second embodiment. However, in the formation of the insulating resin mass 30B, a mask is used that has a smaller width than the width of the photoreceptor element 10, and moreover that has an opening that is longer than the length of the opening 31B and damming projections that are provided along the pair of side edge portions of the opening extending in the longitudinal direction of the opening. Apart from the structure described above, the other constructional features of the photoreception device 1B of this embodiment are the same as those in the photoreception device 1 of the first embodiment and in the photoreception device 1A of the second embodiment, and accordingly, to elements included in this photoreception device 1B that correspond to ones of the photoreception device 1 or 1A, the same reference numerals are appended as in the case of the photoreception device 1 or 1A, and explanation of those elements will be omitted.

With this third embodiment, the same advantageous effects can be obtained as in the case of the first and second embodiments. It should be understood that, in this third embodiment, it is arranged for the entire periphery of the opening 31B to be surrounded by the insulating resin mass 30B. However, it would also be acceptable to arrange for the opening 31B to penetrate from one side of the photoreceptor element 10 all the way through to the other side, as in the second embodiment.

Fourth Embodiment

Figure 13:
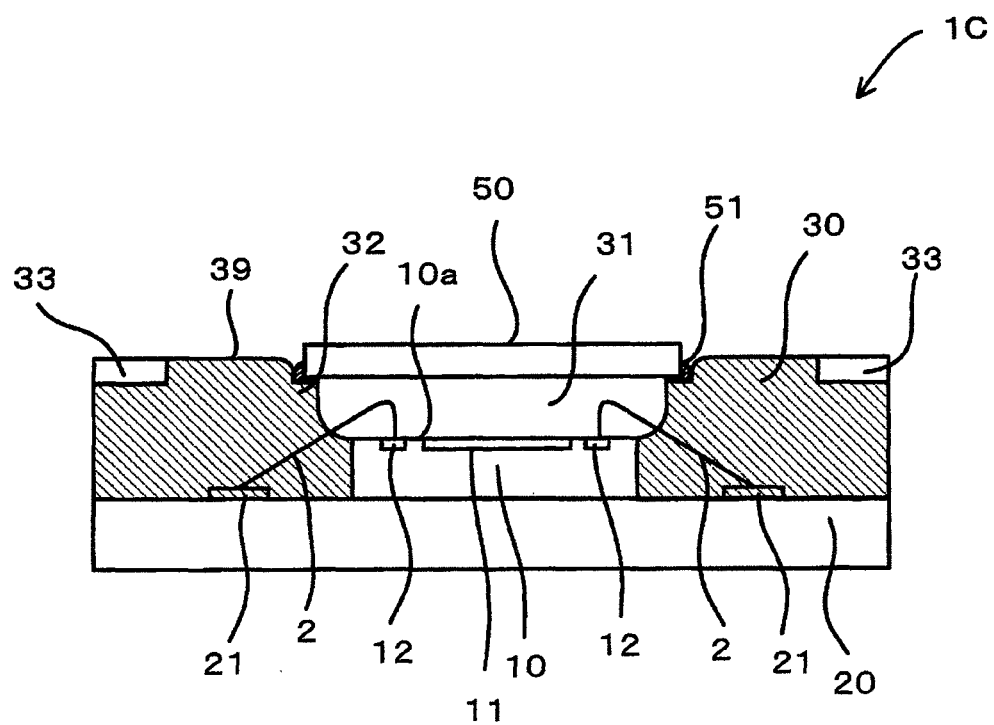
FIG. 13 is a sectional view of a photoreception device according to a fourth embodiment.

FIG. 13 is a sectional view of a photoreception device according to a fourth embodiment of the present invention. In the photoreception device 1C of this fourth embodiment, a translucent member is further provided to the photoreception devices 1 and 1A of the first and second embodiments. In other words, this photoreception device 1C includes a translucent member 50 that is made from glass or the like.

An infra-red radiation filter or a reflective prevention film is formed integrally upon the translucent member 50. This translucent member 50 is installed by being mounted upon the step portion 32B of the insulating resin mass 30, and is adhered to the step portion 32 of the insulating resin mass 30 with adhesive 51. Apart from the structure described above, the other constructional features of the photoreception device 1C of this embodiment are the same as those in the photoreception device 1 of the first embodiment and in the photoreception device 1A of the second embodiment, and accordingly, to elements included in this photoreception device 1C that correspond to ones of the photoreception device 1 or 1A, the same reference numerals are appended as in the case of the photoreception device 1 or 1A, and explanation of those elements will be omitted.

Fifth Embodiment

Figure 14:
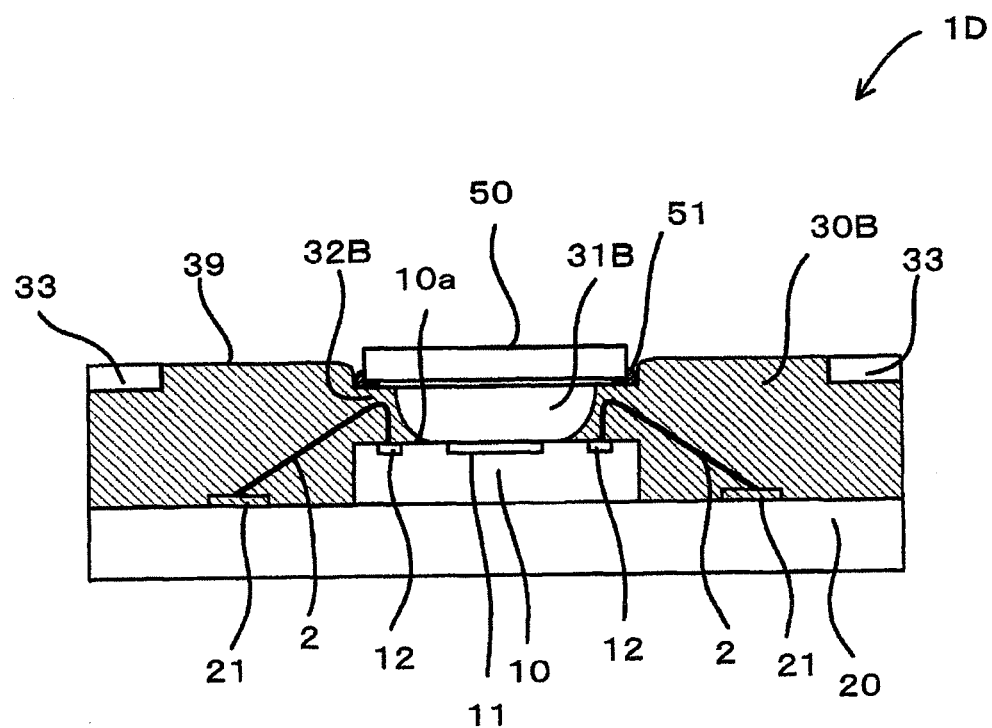
FIG. 14 is an enlarged perspective view showing the external appearance of a photoreception device according to a fifth embodiment.

FIG. 14 is a sectional view of a photoreception device according to a fifth embodiment of the present invention. In the photoreception device 1D of this fifth embodiment, a translucent member is further provided to the photoreception device 1C of the third embodiment. In other words, this photoreception device 1D includes a translucent member 50 that is made from glass or the like.

An infra-red radiation filter, a band pass filter, or a reflection prevention film is formed integrally upon this translucent member 50. The translucent member 50 is installed by being mounted upon the step portion 32B of the insulating resin mass 30B, and is adhered to the step portion 32B of the insulating resin mass 30B with adhesive 51. Apart from the structure described above, the other constructional features of the photoreception device 1D of this embodiment are the same as those in the photoreception device 1C of the third embodiment, and accordingly, to elements included in this photoreception device 1D that correspond to ones of the photoreception device 1C, the same reference numerals are appended as in the case of the photoreception device 1C, and explanation of those elements will be omitted.

In the embodiments described above, examples were explained in which the damming projection 62 for the insulating resin material masses 30a and 30b was provided only upon the mask 60. However, it would also be acceptable to arrange for a damming projection to be provided on the photoreceptor element 10. If a damming projection is provided upon the photoreceptor element 10, then it will be efficient to provide this projection during the wafer manufacturing or producing process. An example of this method is as follows. In detail, in the wafer state, a resin material mass may be spin coated upon the wafer, and, after drying, the portions other than the damming projection may be etched away using a mask that has been patterned with a photoresist in the shape of the damming projection.

In the embodiments described above, the thickness of the insulating resin mass 30 was ensured by making the lower surfaces of the pressure portions 64 that were provided near the external periphery of the mask 60 contact against the upper surface of the substrate 20. However, it would also be possible to arrange to make the height of the projecting portions 63 formed upon the mask 60 be the same as the thickness of the insulating resin mass 30, and to push the mask 60 against the insulating resin material mass 30a until the lower surfaces of the projecting portions 63 contacts against the upper surface of the substrate 20. In this case, there is no need to form any pressure portions in the edge of the external periphery of the mask 60. Or, as another method, it would also be possible to arrange to provide a sensor to a drive member that pushes the mask 60 up and down, and to perform control by measuring the amount of shifting of that sensor.

In the embodiments described above, the notches 33 were formed at the four corners of the photoreception device 1. However, it would also be acceptable to arrange for such a notch 33 to be formed at only one spot. Moreover, it would also be possible to arrange to provide the notches 33 at some locations other than the four corners of the device. Yet further, by forming the plurality of notches 33 to match positions on convex portions upon another member, it would be possible to employ them as marks (i.e. as concave portions) for alignment when the photoreception device 1 is to be assembled to that other member. At this time, this plurality of notches that are concave portions would mate with the convex portions of that other member.

In the embodiments described above, the input and output terminals 12 are arranged along only one pair of mutually opposed side surfaces of the photoreceptor element 10. However, it would also be possible to apply the present invention to a photoreceptor element of which the input and output terminals 12 are arranged along all four side surfaces. It would be possible for all of these wires 2 that are joined by bonding to the input and output terminals 12 arranged along the side surfaces, to be covered over by the insulating resin mass 30, 30A, or 30B; or it would also be possible for certain portions of the wires 2 in the neighborhood of the input and output terminals 12 to be exposed from the insulating resin mass 30, 30A, or 30B.

In the embodiments described above, at a pair of mutually opposed side surfaces of the photoreception device 10, or at all four of its side surfaces, the thickness of the insulating resin mass is formed to be the same, or substantially the same, as the thickness of the photoreception device. However, it would also be acceptable to arrange for the thickness of the insulating resin mass to be formed to be the same, or substantially the same, as the thickness of one of the side surfaces of the photoreception device, or of three of them.

The photoreception device according to the present invention can be constructed in various altered ways. In a photoreception device including an insulating resin mass that is provided at the periphery of a photoreceptor element and in which an opening is formed that exposes a photoreceptor portion of the photoreceptor element, it will be sufficient, along with the insulating resin mass being formed to be thicker than the photoreceptor element at least at a pair of mutually opposed side surfaces of the photoreceptor element, for a step portion also to be provided at the sides of the opening that correspond to that pair of side surfaces.

While various embodiments and variant embodiments are explained in the above description, the present invention is not to be considered as being limited by the details thereof. Other modes of implementation that are considered to fall within the range of the technical idea of the present invention are also included within the scope of the present invention.

The contents of the following application, upon which priority is claimed, are hereby incorporated herein by reference: Japanese Patent Application No. 2011-239192 (filed on 31 Oct., 2011).

The invention claimed is:

1. A photoreception device comprising:
   a substrate that contains a connection terminal upon a surface of the substrate and that is made from an insulating member;
   a photoreceptor element including a photoreceptor portion and an input and output terminal upon an upper surface thereof and a lower surface thereof is mounted upon the surface of the substrate;
   a wire, one end of the wire being bonded to the connection terminal of the substrate and another end of the wire being bonded to the input and output terminal of the photoreceptor element, projecting out above the upper surface of the photoreceptor element near a side toward the another end; and
   an insulating resin mass that contains a flat upper surface and an opening that exposes the photoreceptor portion of the photoreceptor element, that is formed solely upon the surface of the substrate to be thicker than a thickness of the photoreceptor element, as a member for packaging as large as the substrate, and that covers over the wire at least near a side toward the one end and adheres closely against side surfaces of the photoreceptor element, the side surfaces surrounding the photoreceptor element;
   wherein:
   the insulating resin mass contains a step portion that is provided to a height between the flat upper surface thereof and the upper surface of the photoreceptor portion;
   the step portion extends parallel to at least one pair of mutually opposed side surfaces of the photoreceptor element, at a periphery of the opening; and
   an interior side surface of the step portion is provided between a peripheral portion of the photoreceptor portion and the one end of the wire bonded to the connection terminal of the substrate.

2. A photoreception device according to claim 1, wherein:
   an area of the opening of the insulating resin mass is greater than an area of the photoreceptor element; and
   the upper surface of the photoreceptor element is entirely exposed through the opening.

3. A photoreception device according to claim 2, wherein a thickness of a portion where the insulating resin mass closely adheres to the side surfaces surrounding the photoreceptor element is substantially equal to the thickness of the photoreceptor element.

4. A photoreception device according to claim 3, wherein the plurality of wires are arranged along the wire is formed upon each side surface of the at least one pair of mutually opposed side surfaces of the photoreceptor element.

5. A photoreception device according claim 1, wherein:
   the photoreceptor element has a rectangular shape;
   the insulating resin mass is formed to be thicker than the thickness of the photoreceptor element at positions where the step portion corresponding to two mutually opposed pairs of side surfaces of the photoreceptor element is provided;
   the opening is formed in a rectangular shape; and
   the step portion is formed around an entire peripheral portion of the opening.

6. A photoreception device according to claim 1, wherein:
   the photoreceptor element has a rectangular shape;
   the insulating resin mass is formed to be thicker than the thickness of the photoreceptor element at positions where the step portion corresponding to a mutually opposed pair of side surfaces of the photoreceptor element is provided; and
   the opening extends parallel to the mutually opposed pair of side surfaces, and communicates to the exterior at one side end of the opening and at the other side end thereof.

7. A photoreception device according to claim 6, wherein the insulating resin mass covers an edge region of the upper surface of the photoreceptor element in a state in which the photoreceptor portion of the photoreceptor element is exposed through the opening.

8. A photoreception device according to claim 1, wherein a translucent member is adhered to the step portion.

9. A photoreception device according to claim 8, wherein the translucent member is one of an infra-red radiation filter, a band pass filter, and a reflection prevention film.

10. A photoreception device according to claim 1, wherein the insulating resin mass contains at least one notch that is generated by depressing a portion of the flat upper surface.

11. A photoreception device according to claim 10, wherein
the at least one notch is a plurality of notches which are formed to match to positions of convex portions with which the plurality of notches are to mate, the convex portions being upon another member.

12. A method for producing a photoreception device, comprising:
mounting a photoreceptor element upon a substrate that contains a plurality of connection terminals, the photoreceptor element containing a photoreceptor portion and a plurality of input and output terminals;
connecting the plurality of connection terminals and the plurality of input and output terminals to each other respectively by connection members;
applying an insulating resin material mass upon the substrate along a periphery of the photoreceptor element;
along with pushing the insulating resin material mass that has been applied upon the substrate toward the substrate with a mask containing an opening of greater width than a width of the photoreceptor element and upon which a damming projection is formed that projects out toward the photoreceptor element along at least one pair of mutually opposed side edges of the opening, pressing and spreading out the insulating resin material mass toward the photoreceptor element by the damming projection;
forming an insulating resin mass by applying heat to and hardening the insulating resin material mass; and
detaching the mask, wherein,
when pressing the insulating resin material mass toward the substrate with the mask, a flow of the insulating resin material mass is dammed up with side surfaces of the photoreceptor element, so that a step portion of the insulating resin mass is formed in a periphery of the side surfaces, a thickness of the step portion being substantially equal to a thickness of the photoreceptor element.

13. A method for producing a photoreception device according to claim 12, wherein,
when pressing and spreading out the insulating resin material mass towards the photoreceptor element, the insulating resin mass is applied around the damming projection of the mask.

14. A method for producing a photoreception device according to claim 13, wherein:
the mask includes a pressure portion positioned more toward an external periphery of the mask than the damming projection, a height of the pressure portion being greater than a height of the damming projection; and
when pressing the insulating resin material mass toward the substrate with the mask, the mask is pushed until a lower surface of the pressure portion contacts against an upper surface of the substrate.

15. A method for producing a photoreception device according to claim 12, wherein:
the mask includes a projecting portion in a region that corresponds to a periphery of the photoreceptor element; and
when pressing the insulating resin material mass toward the substrate with the mask, a notch is formed at a portion of a flat upper surface of the insulating resin material mass, the portion of the flat upper surface corresponding to the lower surface of the projecting portion.

16. A method for producing a photoreception device according to claim 12, wherein:
when mounting the photoreceptor element upon the substrate, another photoreceptor element is mounted upon the substrate adjacent to the photoreceptor element;
when pressing the insulating resin material mass that has been applied around the periphery of the photoreceptor element toward the substrate with the mask, an insulating resin material mass that has been applied around a periphery of the another photoreceptor element is pressed toward the substrate with the mask; and
after having formed the insulating resin masses by applying the heat to and hardening the insulating resin material mass, a plurality of photoreception devices are obtained by cutting up the substrate and the insulating resin masses.

17. A method for producing a photoreception device according to claim 12, wherein
a viscosity of the insulating resin material mass is from 200 to 350 Pa·s.

18. A method for producing a photoreception device according to claim 12, wherein
a translucent member that includes one of an infra-red radiation filter, a band pass filter, or a reflection prevention film is adhered to the step portion of the insulating resin mass.

* * * * *